US012757658B2

(12) United States Patent
Acosta Alba et al.

(10) Patent No.: US 12,757,658 B2
(45) Date of Patent: Oct. 6, 2026

(54) METHOD FOR MANUFACTURING A SIGE CHANNEL FIELD EFFECT TRANSISTOR

(71) Applicant: COMMISSARIAT À L'ENERGIE ATOMIQUE ET AUX ENERGIES ALTERNATIVES, Paris (FR)

(72) Inventors: Pablo Acosta Alba, Grenoble Cedex (FR); Claire Fenouillet-Beranger, Grenoble Cedex (FR); Rémy Gassilloud, Grenoble Cedex (FR); Sébastien Kerdiles, Grenoble Cedex (FR); Shay Reboh, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 399 days.

(21) Appl. No.: 18/538,292

(22) Filed: Dec. 13, 2023

(65) Prior Publication Data

US 2024/0194485 A1 Jun. 13, 2024

(30) Foreign Application Priority Data

Dec. 13, 2022 (FR) ....................................... 2213226

(51) Int. Cl.
*H10D 30/01* (2025.01)
*H10D 62/17* (2025.01)
*H10P 34/42* (2026.01)

(52) U.S. Cl.
CPC ........... *H10P 34/42* (2026.01); *H10D 30/021* (2025.01); *H10D 62/314* (2025.01)

(58) Field of Classification Search
CPC .... H10P 34/42; H10D 62/314; H10D 30/021; H10D 62/299; H10D 62/235;
(Continued)

(56) References Cited

U.S. PATENT DOCUMENTS 6,743,680 B1 6/2004 Yu
6,783,591 B1 * 8/2004 Halliyal ............. H10D 30/0212 117/41

(Continued)

FOREIGN PATENT DOCUMENTS

CN 113299548 A * 8/2021 ......... H10D 64/0135
EP 1 868 232 B1 2/2009

OTHER PUBLICATIONS

Monflier et al., Investigation of oxygen penetration during UV nanosecond laser annealing of silicon at high energy densities, Applied Surface Science, vol. 546, Jan. 2021, 7 Pages. (Year: 2021).*

(Continued)

*Primary Examiner* — Eric W Jones
*Assistant Examiner* — Michael B Sun
(74) *Attorney, Agent, or Firm* — CUSHMAN PARTNERS, LLC

(57) ABSTRACT

A method for manufacturing a field effect transistor including a silicon-germanium active layer and a gate oxide layer disposed on the active layer, the method including providing a stack including a substrate and a silicon-germanium first layer disposed on the substrate; forming the gate oxide layer on the stack; subjecting the stack to laser annealing so as to melt a region of the stack, the region including at least one part of the first layer, and recrystallising the molten region of the stack to obtain the silicon-germanium active layer in contact with the gate oxide layer, the active layer having a germanium concentration gradient.

13 Claims, 3 Drawing Sheets

- S13 -

(58) Field of Classification Search
CPC .. H10D 30/027; H10D 30/751; H10D 64/691; H10D 64/68; H10D 64/681; H10D 64/685; H10D 64/01356
See application file for complete search history.

(56) References Cited

U.S. PATENT DOCUMENTS

| | | | | |
|---|---|---|---|---|
| 9,373,638 | B1 | 6/2016 | Lauer et al. | |
| 2005/0186765 | A1* | 8/2005 | Ma | H10D 64/01306 438/533 |
| 2006/0251241 | A1* | 11/2006 | Lee | H04N 1/00901 379/399.01 |
| 2008/0296614 | A1* | 12/2008 | Uejima | H10D 30/601 257/190 |
| 2013/0240957 | A1* | 9/2013 | Lee | H10D 30/0278 257/E21.334 |
| 2016/0049335 | A1 | 2/2016 | Liu et al. | |
| 2018/0076040 | A1* | 3/2018 | Ando | H10D 30/0223 |
| 2018/0315663 | A1 | 11/2018 | Bao et al. | |
| 2018/0337098 | A1 | 11/2018 | Ando et al. | |
| 2021/0119032 | A1 | 4/2021 | Chang et al. | |
| 2022/0093738 | A1* | 3/2022 | Li | H10D 30/0275 |

OTHER PUBLICATIONS

Search Report as issued in French Patent Application No. FR2213226, dated Sep. 1, 2023.

Search Report as issued in French Patent Application No. FR2213224, dated Jul. 21, 2023.

Search Report as issued in French Patent Application No. FR2213229, dated Jul. 21, 2023.

Huet, K., et al., "Pulsed laser annealing for advanced technology nodes: Modeling and 12-15 calibration," Applied Surface Science, vol. 505, Nov. 2019, 9 pages.

Dagault, L., et al., "Investigation of recrystallization and stress relaxation in nanosecond laser annealed $Si_{1-x}Ge_x$/Si epilayers," Applied Surface Science, vol. 527, Oct. 2020, XP093059462, 10 pages.

Franco, J., et al., "BTI Reliability Improvement Strategies in Low Thermal Budget Gate Stacks for 3D Sequential Integration," IEEE Transactions on Very Large Scale Integration (VLSI), (Year: 2018), 4 pages.

Lee C. H., et al., "Selective GeOx-Scavenging from Interfacial Layer on $Si_{1-x}Ge_x$ Channel for High Mobility Si/$Si_{1-x}Ge_x$ CMOS Application," 2016 IEEE Symposium on VLSI Technology, (Year: 2016), 2 pages.

Franco, J., et al., SiGe Channel Technology: Superior Reliability Toward Ultrathin EOT Devices—Part I: NBTI, IEEE Transactions on Electron Devices, vol. 60, No. 1, Jan. 2013, pp. 396-404.

* cited by examiner

[Fig. 1]
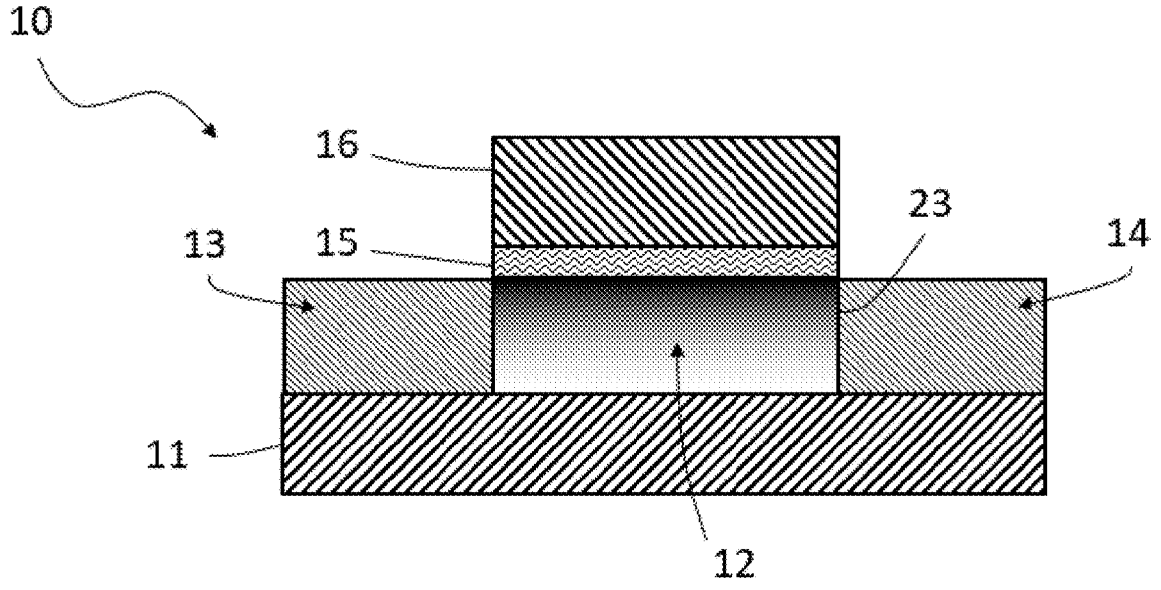
[Fig. 2A]
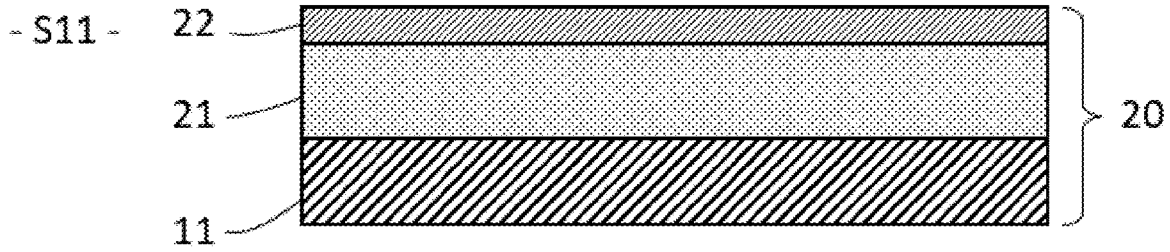
[Fig. 2B]
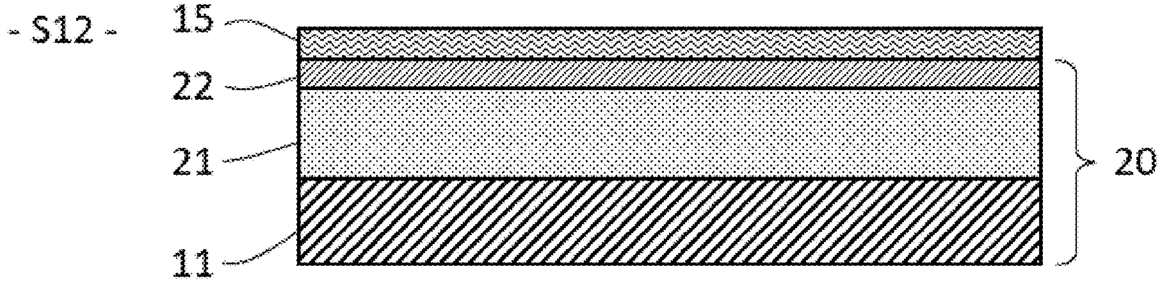

[Fig. 2C]
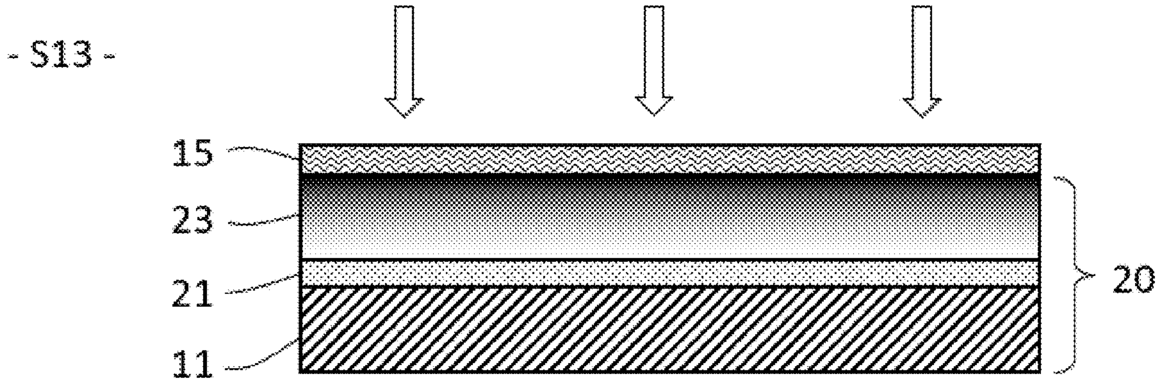
[Fig. 3A]
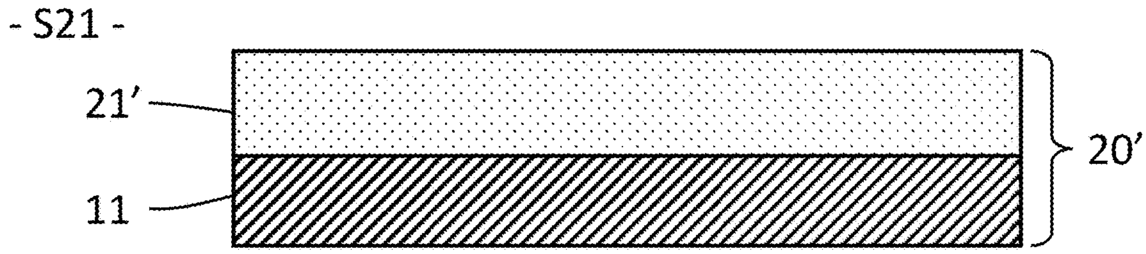
[Fig. 3B]
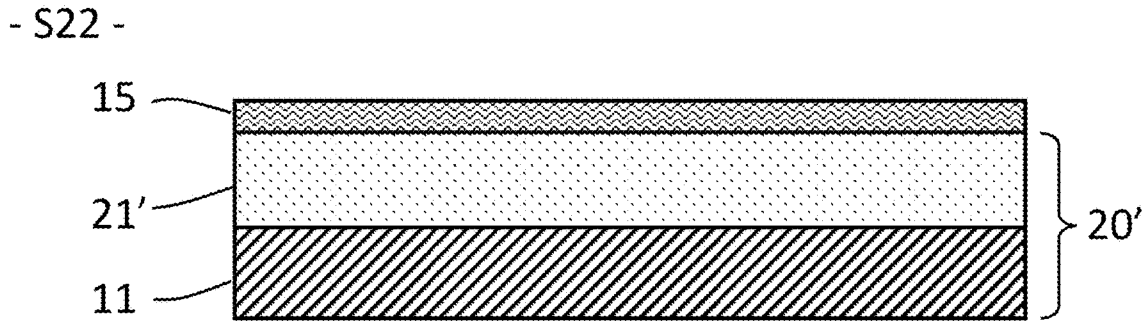

[Fig. 3C]
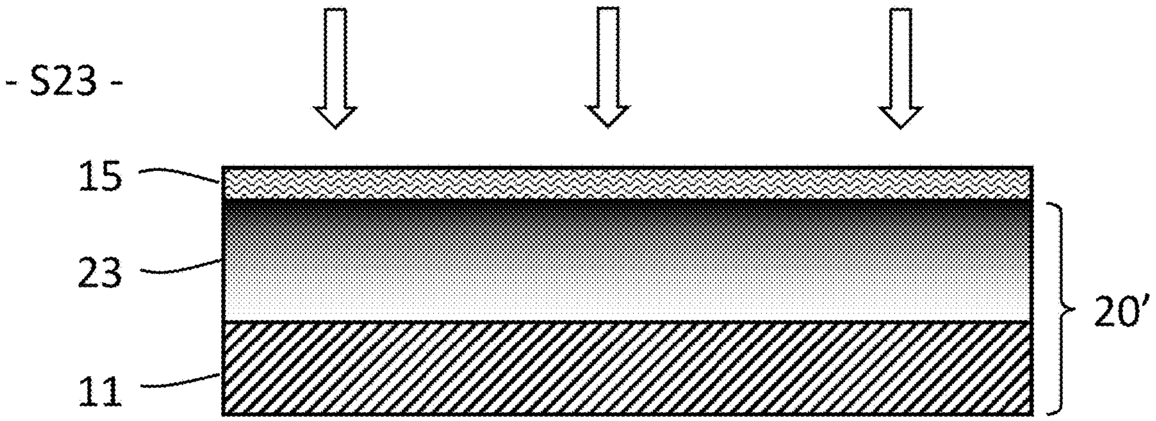

METHOD FOR MANUFACTURING A SIGE CHANNEL FIELD EFFECT TRANSISTOR

CROSS-REFERENCE TO RELATED APPLICATIONS

This application claims priority to French Patent Application No. 2213226, filed Dec. 13, 2022, the entire content of which is incorporated herein by reference in its entirety.

FIELD

The present invention relates to techniques for manufacturing field effect transistors (FETs). The invention relates more particularly to a method for manufacturing a SiGe channel field effect transistor.

BACKGROUND

One of the most promising CMOS (Complementary Metal-Oxide-Semiconductor) architectures for current and future technology nodes is the use of silicon (Si) channels for NMOS type field effect transistors and silicon-germanium (SiGe) channels for PMOS type field effect transistors. The use of SiGe channels for PMOS transistors is known to improve mobility of charge carriers (holes) and decrease the threshold voltage of the transistors compared with silicon alone. A high germanium concentration (typically greater than 20%) is generally sought, as the mobility of charge carriers increases with germanium concentration. To further improve mobility of charge carriers, Si channels can be tensile-stressed and SiGe channels can be compressive-stressed.

Making a reliable gate structure on a SiGe layer with a high germanium concentration is however delicate. In particular, thermal oxidation of such a layer leads to the growth of a $GeO_x$-type oxide of poor electrical quality. More precisely, the mixture of silicon oxide ($SiO_x$) and germanium oxide ($GeO_x$) generates a greater number of interface defects compared with pure silicon oxide, which leads to greater trapping of charge carriers and therefore a decrease in the performance of PMOS transistors. The $GeO_x$ concentration of the oxide layer is about equal to that of germanium in the SiGe layer and becomes problematic above 10%.

Document US2018/076040 describes a method for manufacturing a field effect transistor comprising a silicon oxide interface layer disposed between a SiGe channel region and a layer of high dielectric constant dielectric material (so-called "high-k" dielectric material). The manufacturing method comprises a step of growing a SiGe active layer (germanium concentration between 20% and 70%) on the surface of a substrate, a step of forming a silicon oxynitride (SiON) layer on the surface of the active layer by means of a first oxynitriding method, a step of removing the SiON layer and a step of forming the "pure" silicon oxide or $SiO_2$ interface layer by means of a second oxynitriding method. The second oxynitriding method is identical or substantially identical to the first oxynitriding method. The first oxynitriding method treats the surface of the SiGe active layer so as to prevent formation of $GeO_x$ and introduction of nitrogen into the silicon oxide interface layer formed during the second oxynitriding method. Thus, the silicon oxide interface layer is virtually devoid of nitrogen and $GeO_x$.

This manufacturing method makes it possible to obtain a high-quality gate oxide layer (of $SiO_2$) on a SiGe layer with a high germanium concentration. However, it is time-consuming to implement. Furthermore, it can consume silicon in the case of a silicon-on-insulator (SOI) type substrate with a small channel thickness (to form FDSOI type transistors). Finally, the oxynitriding methods are performed at temperatures of between 600° C. and 800° C., which is not compatible with the manufacture of a higher level of transistors, carried out at low temperature (<500° C.) so as not to damage the transistors previously made in a lower level.

Besides, document ["Investigation of recrystallization and stress relaxation in nanosecond laser annealed $Si_{1-x}Ge_x$/Si epilayers"; L. Dagault et al; Applied Surface Science, Volume 527, 2020] describes a SiGe layer epitaxially formed on a silicon substrate, then subjected to nanosecond laser annealing (NLA). Nanosecond laser annealing results in at least one partially melting the SiGe layer. A redistribution of germanium atoms is observed during the recrystallisation of the SiGe layer. The germanium atoms are "sucked" towards the surface of the SiGe layer due to a segregation mechanism. The result is a germanium concentration gradient across the thickness of the SiGe layer. This technique can be used to decrease the electrical resistivity of source and drain contacts in PMOS transistors (SiGe source and drain regions).

SUMMARY

There is therefore a need to manufacture a high performance SiGe channel field effect transistor in a simpler and faster way.

According to an aspect of the invention, this need tends to be satisfied by providing a method for manufacturing a field effect transistor comprising a silicon-germanium active layer and a gate oxide layer disposed on the active layer, the method comprising the following steps of:

- providing a stack comprising a substrate and a silicon-germanium first layer disposed on the substrate;
- forming the gate oxide layer on the stack; and
- subjecting the stack to laser annealing so as to melt a region of the stack, the region comprising at least one part of the first layer, and recrystallising the molten region of the stack to obtain the silicon-germanium active layer in contact with the gate oxide layer, the active layer having a germanium concentration gradient.

The laser annealing step makes it possible to concentrate the germanium atoms at the interface with the gate oxide layer, without damaging the latter. Thus, in this manufacturing method, the germanium concentration gradient of the active layer is obtained after forming the gate oxide (or at the same time), and not before (during the epitaxial growth step, for example).

In a first embodiment of the manufacturing method, the stack further comprises a silicon second layer disposed on the first layer and the region further comprises at least one part of the second layer.

According to a development of this first embodiment, the gate oxide layer may be formed by thermally or chemically oxidising at least one portion of the second layer or by exposing the second layer to an oxygen-containing plasma.

The silicon second layer beneficially has a thickness of between 0.2 nm and 15 nm, such as between 0.8 nm and 6 nm.

In an embodiment, the silicon-germanium first layer has a germanium concentration of between 1% and 80%, beneficially between 10% and 60%.

The gate oxide layer may consist of silicon dioxide and have a thickness of between 0.5 nm and 6 nm.

In a second embodiment, the silicon-germanium first layer has a germanium concentration of between 5% and 10%.

According to a development of this second embodiment, the gate oxide layer is formed by thermally or chemically oxidising at least one portion of the first layer or by exposing the first layer to an oxygen-containing plasma.

According to another development, the gate oxide layer comprises silicon dioxide and germanium oxide, the percentage of germanium oxide being less than or equal to 10%, and the gate oxide layer has a thickness of between 0.5 nm and 6 nm.

The manufacturing method according to an aspect of the invention may also have one or more of the following characteristics, considered individually or according to any technically possible combinations:

- the molten region of the stack extends to the gate oxide layer;
- the gate oxide layer is formed so as to have a percentage of germanium oxide ($GeO_x$) less than or equal to 10%;
- the method further comprises a step of depositing a layer of high dielectric constant dielectric material onto the gate oxide layer;
- the layer of high dielectric constant dielectric material is formed before or after the laser annealing step;
- the laser annealing is performed by exposing the stack to laser radiation having a wavelength between 200 nm and 600 nm and an energy density between 0.1 J/cm$^2$ and 10 J/cm$^2$ for a duration between 10 ns and 1000 ns;
- the gate oxide layer is formed before the laser annealing step or during the laser annealing step;
- the laser annealing is performed in an oxygen-devoid atmosphere;
- the laser annealing is performed in an oxygen-containing atmosphere to simultaneously form the gate oxide layer;
- the method further comprises a step of forming a gate electrode on the gate oxide layer;
- the method further comprises a step of forming source and drain regions; and
- the transistor comprises a channel region formed by the active layer and source and drain regions disposed on either side of the channel region.

BRIEF DESCRIPTION OF THE FIGURES

Further characteristics and benefits of the invention will be apparent from the description given below, by way of indicating and in no way limiting purposes, with reference to the following figures.

FIG. 1 schematically represents a SiGe channel field effect transistor;

FIGS. 2A to 2C represent a first embodiment of the method for manufacturing a field effect transistor according to the invention; and FIGS. 3A to 3C represent a second embodiment of the method for manufacturing a field effect transistor according to the invention.

For the sake of clarity, identical or similar elements are marked by identical reference signs throughout the figures.

DETAILED DESCRIPTION

FIG. 1 is a schematic cross-section view of a SiGe channel field effect transistor 10. The field effect transistor 10 comprises a substrate 11, a channel region 12 disposed on the substrate 11, drain and source regions 13-14 disposed on the substrate 11 on either side of the channel region 12, a gate oxide layer 15 disposed on the channel region 12 and a gate electrode 16 disposed on the gate oxide layer 15. The gate electrode 16 is separated from the channel region 12 by the gate oxide layer 15.

The field effect transistor 10 is beneficially of the PMOS type. The drain and source regions 13-14 are then P-type doped semiconductor regions.

The channel region 12 comprises a silicon-germanium (SiGe) active layer 23 in contact with the gate oxide layer 15. This SiGe active layer 23 can be compressive-stressed or, on the contrary, relaxed, that is, subjected to no tensile or compressive stress. It has a germanium concentration gradient across its thickness. In an embodiment, the germanium concentration increases towards the interface between the active layer 23 and the gate oxide layer 15 and reaches a maximum value at this interface. The maximum value of the germanium concentration is beneficially between 30% and 80% (in atomic percentage) to give high mobility to the electric charge carriers in the channel region 12 and to decrease the threshold voltage of the transistor. In an embodiment, the gate oxide layer 15 has a thickness of between 0.5 nm and 6 nm.

The field effect transistor 10 may also comprise a layer of high dielectric constant dielectric material (not represented) disposed between the gate oxide layer 15 and the gate electrode 16. A high dielectric constant dielectric material (so-called "high-k" dielectric material) refers to a material with a dielectric constant k greater than the dielectric constant of silicon dioxide ($SiO_2$), namely greater than 3.9.

FIGS. 2A to 2C represent steps S11 to S13 of a method for manufacturing the field effect transistor 10, according to a first embodiment of the invention. These steps relate to the formation of the SiGe active layer 23 (forming the channel region 12) and the gate oxide layer 15.

Step S11 of FIG. 2A consists in providing a stack 20 comprising the substrate 11, a SiGe first layer 21 disposed on the substrate 11 and a silicon second layer 22 disposed on the first layer 21.

The substrate 11 may be a bulk substrate of a semiconductor material (for example, silicon, germanium, silicon-germanium or silicon carbide) or a silicon-on-insulator (SOI) type substrate.

The SiGe first layer 21 is in an embodiment formed by epitaxy on a face of the substrate 11. The SiGe first layer 21 beneficially has a germanium concentration (also called atomic percentage of germanium) of between 1% and 80%, such as between 5% and 60% and in an embodiment between 10% and 60%. The higher the percentage of germanium, the smaller the number of defects that can capture holes accumulated in the SiGe film.

The thickness of the SiGe first layer 21 can be between 5 nm and 50 nm. In an embodiment, the SiGe first layer 21 does not have a Ge concentration gradient after step S11.

The Si second layer 22 can also be formed by epitaxy on the first layer 21. Its thickness is in an embodiment between 0.2 nm and 15 nm, such as between 0.8 nm and 6 nm.

In step S12 of FIG. 2B, the gate oxide layer 15 of the transistor is formed on the stack 20, for example by thermally oxidising at least one portion of the second layer 22. Thermal oxidation of the silicon second layer 22 makes it easy to obtain a gate oxide layer 15 consisting of silicon dioxide ($SiO_2$) and having a low defect density, in other words a high-quality gate oxide layer 15. The gate oxide layer 15 can be considered to be of high quality when it has a density of interface states $D_{it}$ of less than $2\times10^{11}$/cm$^2$/eV.

A high-quality gate oxide layer prevents degradation of the mobility of charge carriers in the channel region of the transistor and therefore leads to improved current performance.

Thermal oxidation is carried out by introducing the stack 20 into the chamber of a furnace (for example consisting of a quartz tube), injecting into the chamber a gas containing oxygen (for example dioxygen) and possibly a neutral gas (such as dinitrogen, $N_2$), then heating the stack 20 to a temperature of between 400° C. and 1200° C., such as between 400° C. and 500° C.

Alternatively, the gate oxide layer 15 of the transistor is formed by exposing the second layer 22 to an oxygen-containing plasma, for example $H_2O$ plasma. The plasma is in an embodiment formed (in the chamber of a reactor) at a temperature less than or equal to 500° C.

Still alternatively, the gate oxide layer 15 is formed by thermal oxidation using nanosecond laser annealing in the presence of oxygen (typically $O_2$).

Still alternatively, the gate oxide layer 15 is formed by chemical oxidation, for example in an $HF+O_3$ bath or under ammonia $NH_4OH+H_2O_2$.

These alternative methods also make it possible to obtain a high-quality gate oxide layer 15.

A large thickness of the Si second layer 22 allows partial oxidation of the second layer 22, whereas with a small thickness, the second layer 22 will be fully oxidised.

Once the oxide layer 15 has been formed, it can be subjected to a nitriding post-treatment, for example by annealing under $NH_3$ at 650° C. in a furnace, or by a plasma nitriding treatment in the chamber of a reactor at a temperature of 500° C. or less.

Finally, in step S13 of FIG. 2C, the stack 20 is subjected to laser annealing so as to melt a region of the stack 20, this region comprising at least one part of the second layer 22 and at least one part of the first layer 21, and possibly part of the substrate 11. Then, on cooling, the molten region of the stack 20 recrystallises to form the active layer 23 comprising a germanium concentration gradient.

The germanium concentration gradient of the active layer 23 results from a redistribution of the germanium atoms of the SiGe first layer 21, during melting and recrystallisation of the region of the stack 20. The germanium atoms are concentrated in the upper part of the stack 20, at the interface with the gate oxide layer 15. Thus, the electric charge carriers of the field effect transistor 10 will benefit from a high mobility in the channel region 12.

The thickness of the molten region may vary as a function of the initial germanium concentration of the first layer 21 and as a function of the gradient sought to be obtained. For example, if it is desired to obtain a concentration of about 80% at the interface with the gate oxide layer 15 and to obtain a gradient between the interface with the gate oxide layer 15 and the first ten nanometres of the first layer 21, while the first layer 21 has a thickness of 30 nm with a Ge concentration of 40%, then the thickness of the molten region will be about 45 nm (corresponding to an energy density of 2.2 $J/cm^2$ for 160 ns and a wavelength of 308 nm). The thickness of the molten region is beneficially greater than or equal to 15 nm, in order to minimise crystalline defects.

In an embodiment, the initial germanium concentration of the first layer 21 and the thickness of the molten region (in particular in the first layer 21) are chosen so as to obtain a maximum germanium concentration at the interface with the gate oxide layer 15 of between 30% and 80%.

Laser annealing is performed by exposing the surface of the gate oxide layer 15 to radiation emitted by a laser source. Thus, the laser radiation passes through the gate oxide layer 15. However, the latter is not altered by the laser radiation. It is neither molten nor damaged.

The laser radiation beneficially has a wavelength of between 200 nm and 600 nm (for example equal to 248 nm, 308 nm or 532 nm) and an energy density of between 0.1 $J/cm^2$ and 10 $J/cm^2$, such as between 1.7 $J/cm^2$ and 2.5 $J/cm^2$. The duration of exposure to the laser radiation (for each surface unit of the gate oxide layer 15) can be between 10 ns and 1000 ns (pulse half-height width). This is also known as Nanosecond Laser Annealing (NLA).

By way of example, laser annealing is performed using an XeCl gas laser with a wavelength of 308 nm at an energy density of between 1.7 and 3 $J/cm^2$ for a duration of 160 ns (half-height width).

When only part of the first layer 21 is molten, the active layer 23 is disposed between the gate oxide layer 15 and the remaining part of the first layer 21.

The first layer 21 can be completely molten during laser annealing. The active layer 23 then extends from the substrate 11 to the gate oxide layer 15. Part of the substrate 11 may also be molten.

FIGS. 3A to 3C represent steps S21 to S23 of a method for manufacturing the field effect transistor 10, according to a second embodiment of the invention. This second embodiment differs from the first embodiment only in the constitution of the starting stack.

Thus, in step S21 of FIG. 3A, the stack 20' provided comprises the substrate 11 and a silicon-germanium layer 21' disposed on the substrate 11. The stack 20' is devoid of the silicon second layer 22. Furthermore, in this second embodiment, the SiGe' layer 21 has a Ge concentration of between 5% and 10%.

In step S22 of FIG. 3B, the gate oxide layer 15 is formed on the stack 20', by thermally oxidising at least one part of the SiGe layer 212 (rather than the Si second layer 22) or by exposing the SiGe layer 212 to an oxygen-containing plasma. The gate oxide layer 15 essentially comprises silicon dioxide (it is comprised of more than 90% $SiO_2$). Due to the low germanium concentration of the SiGe 21'layer, the gate oxide layer 15 contains a low proportion of germanium oxide ($GeO_x$), typically less than or equal to 10%. The gate oxide layer 15 is therefore of a higher quality than that obtained by the method of prior art and does not affect the performance of the transistor.

Finally, in step S23 of FIG. 3C, a region of the stack 20' is molten by laser annealing and then recrystallised to form the active layer 23. The region of the stack 20' molten by the laser comprises all or part of the SiGe' layer 21, and possibly part of the substrate 11. Laser annealing is in an embodiment performed as described in relation with FIG. 2C. The thickness of the molten region is beneficially greater than or equal to 15 nm, in order to minimise crystalline defects.

In an embodiment, the initial germanium concentration of the SiGe 21' layer and the thickness of the molten region (in particular in this SiGe 21' layer) are chosen so as to obtain a maximum germanium concentration at the interface with the gate oxide layer 15 of between 30% and 80%.

The method for manufacturing a field effect transistor described above in relation with FIG. 2A-2C or 3A-3C makes it possible to obtain a high-quality gate oxide layer 15 and a germanium-rich active layer 23 at the interface with the gate oxide layer 15. It is furthermore fast and simple to implement.

The gate oxide layer 15 is in an embodiment formed in step S12/22 so as to have a percentage of germanium oxide ($GeO_x$) less than or equal to 10% and beneficially zero.

Laser annealing may be performed in an oxygen-devoid atmosphere, typically neutral atmosphere (for example, under $N_2$), so as not to increase the thickness of the gate oxide layer 15 already formed.

In an alternative embodiment, the gate oxide layer 15 is formed during the laser annealing step S13 or S23 (and more particularly during the melting/recrystallisation operation) by adding oxygen (typically $O_2$) to the annealing atmosphere. In other words, steps S12/S22 and S13/S23 are simultaneous.

Laser annealing can be performed using a single radiation pulse or several successive radiation pulses (received at the same location). This applies for both embodiments of the method (step S13 or S23), with or without simultaneous formation of the gate oxide layer 15.

After step S12 (FIG. 2B) or S22 (FIG. 3B) of forming the gate oxide layer 15, the manufacturing method may include a step of depositing a layer of high-k dielectric material onto the gate oxide layer 15. The high-k dielectric material is, for example, hafnium oxide ($HfO_2$). The thickness of the layer of high-k dielectric material may be between 0.5 nm and 5 nm, such as between 2 nm and 3 nm.

The layer of high-k dielectric material may be deposited before the step S13 or S23 of laser annealing and recrystallising the active layer 23, insofar as this layer of high-k dielectric material is not affected by the laser annealing (just like the gate oxide layer 15). The high-k dielectric material layer can also be deposited after the laser annealing step S13 or S23.

The manufacturing method may also include a step of forming the gate electrode 16 and a step of forming the drain and source regions 13-14 after the active layer 23 has been obtained (therefore after laser annealing). The way in which these steps are performed may depend on the type of field effect transistor desired: single gate MOSFET transistor or multiple gate MOSFET transistor (FinFET, GAAFET), transistors on a bulk substrate or transistors of the partially or completely depleted silicon-on-insulator type (PDSOI, FDSOI).

The method for manufacturing the field effect transistor 10 may especially comprise the following operations:

- depositing at least one layer of electrically conductive material (in an embodiment a metal or doped polycrystalline silicon) onto the gate oxide layer 15 (or onto the high-k dielectric layer, if necessary);
- etching said at least one layer of electrically conductive material, thus forming the gate electrode 16, for example with etch stop on the gate oxide layer 15 (or the high-k dielectric layer);
- etching the gate oxide layer 15 (and the high-k dielectric layer, if necessary) outside the gate electrode 16;
- forming spacers of one or more electrically insulating materials;
- a step of implanting P-type dopants (boron (for example, $BF_2^+$ ions, or in PAI (preamorphisation) combination with germanium), aluminium, gallium, etc.) into two distinct regions of the active layer 23 located outside the gate stack (the gate stack comprising the gate oxide layer 15, the possible high-k dielectric layer and the gate electrode 16) to form the drain and source regions 13-14, the non-implanted portion of the active layer 23 then forming the channel region 12 of the transistor 10.

As these other manufacturing steps are conventional, they will not be described in further detail.

Instead of the ion implantation step, the manufacturing method may comprise etching the active layer 23 and a step of epitaxially growing doped silicon-germanium or doped silicon to form the drain and source regions 13-14 (FDSOI transistors especially). It may also comprise a final so-called "forming" annealing step aimed at reducing density of interface states (Dit), such as at a temperature less than or equal to 500° C.

This manufacturing method is particularly beneficial in the case of 3D integration (sequential or monolithic) of field effect transistors, because nanosecond laser annealing does not damage previously formed transistors (respecting the thermal budget of these transistors).

It will be appreciated that the various embodiments and aspects of the inventions described previously are combinable according to any technically permissible combinations.

The articles "a" and "an" may be employed in connection with various elements, components, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The invention claimed is:

1. A method for manufacturing a field effect transistor comprising a silicon-germanium active layer and a gate oxide layer disposed on the active layer, the method comprising:

- providing a stack including a substrate, a silicon-germanium first layer disposed on the substrate and a silicon second layer disposed on the first layer;
- forming the gate oxide layer on the stack, and
- subjecting the stack to laser annealing so as to melt a region of the stack, said region comprising at least one part of the first layer and at least one part of the second layer, and recrystallising the molten region of the stack to obtain the silicon-germanium active layer in contact with the gate oxide layer, the active layer having a germanium concentration gradient;
- wherein the gate oxide layer is formed before the laser annealing or during the laser annealing.

2. The method according to claim 1, wherein the gate oxide layer is formed by thermally or chemically oxidising at least one portion of the second layer or by exposing the second layer to an oxygen-containing plasma.

3. The method according to claim 1, wherein the silicon second layer has a thickness of between 0.2 nm and 15 nm.

4. The method according to claim 3, wherein the silicon second layer has a thickness of between 0.8 nm and 6 nm.

5. The method according to claim 1, wherein the gate oxide layer consists of silicon dioxide and has a thickness of between 0.5 nm and 6 nm.

6. The method according to claim 1, wherein the silicon-germanium first layer has a germanium concentration of between 1% and 80%.

7. The method according to claim 6, wherein the silicon-germanium first layer has a germanium concentration of between 10% and 60%.

8. The method according to claim 1, further comprising depositing a layer of high dielectric constant dielectric material onto the gate oxide layer.

9. The method according to claim 8, wherein the layer of high dielectric constant dielectric material is formed before the laser annealing.

10. The method according to claim 1, wherein the laser annealing is performed by exposing the stack to laser radiation having a wavelength between 200 nm and 600 nm and an energy density between 0.1 $J/cm^2$ and 10 $J/cm^2$ for a duration between 10 ns and 1000 ns.

11. The method according to claim 1, wherein the laser annealing is performed in an oxygen-devoid atmosphere.

12. The method according to claim 1, wherein the laser annealing is performed in an oxygen-containing atmosphere to simultaneously form the gate oxide layer.

13. The method according to claim 1, further comprising forming a gate electrode on the gate oxide layer and forming source and drain regions.

* * * * *